US012209304B2

(12) United States Patent
Zenou

(10) Patent No.: US 12,209,304 B2
(45) Date of Patent: Jan. 28, 2025

(54) METHODS FOR PRINTING METAL LINES AND PATTERNS AT HIGH RESOLUTION

(71) Applicant: Reophotonics Ltd., Modiin (IL)

(72) Inventor: Michael Zenou, Hashmonaim (IL)

(73) Assignee: Reophotonics Ltd., Modiin (IL)

( * ) Notice: Subject to any disclaimer, the term of this patent is extended or adjusted under 35 U.S.C. 154(b) by 17 days.

(21) Appl. No.: 18/187,492

(22) Filed: Mar. 21, 2023

(65) Prior Publication Data
US 2023/0398802 A1 Dec. 14, 2023

Related U.S. Application Data

(60) Provisional application No. 63/366,025, filed on Jun. 8, 2022.

(51) Int. Cl.
*C23C 14/04* (2006.01)
*C23C 14/28* (2006.01)
*H05K 3/12* (2006.01)
*H05K 3/18* (2006.01)

(52) U.S. Cl.
CPC .............. *C23C 14/28* (2013.01); *H05K 3/18* (2013.01); *C23C 14/048* (2013.01); *H05K 3/1275* (2013.01); *H05K 2203/107* (2013.01)

(58) Field of Classification Search
None
See application file for complete search history.

(56) References Cited

U.S. PATENT DOCUMENTS

| 4,970,196 A | 11/1990 | Kim et al. |
| 5,163,565 A | 11/1992 | Caskey |
| 10,471,538 B2 | 11/2019 | Zenou et al. |
| 2009/0011677 A1* | 1/2009 | Ikeda .................... C23C 14/048 445/24 |
| 2020/0215816 A1* | 7/2020 | Watt ........................... B41J 2/02 |
| 2021/0237184 A1* | 8/2021 | Zenou .................. B23K 3/0638 |
| 2022/0009247 A1* | 1/2022 | Arutinov .................. B41J 2/005 |

OTHER PUBLICATIONS

Biver Emeric et al: "Multi-jets formation 1-15 using laser forward transfer", Applied Surface Science, Elsevier, Amsterdam, NL, vol. 302, Oct. 18, 2013 (Oct. 18, 2013) (Year: 2013).*

(Continued)

*Primary Examiner* — Jose I Hernandez-Kenney
(74) *Attorney, Agent, or Firm* — Ascenda Law Group, PC

(57) ABSTRACT

A solvent layer is coated on a metal layer carried by a donor substrate, allowing the fabrication of solid metal lines at a high resolution. The laser jetting involves ejecting metal particles, constrained within a solvent membrane, from the metal layer. Once the metal particles have been deposited onto a receiver substrate, the solvent can be evaporated. Since this printing procedure can be performed with the solvent layer in direct contact with the receiver substrate or separated therefrom by a small distance, the resolution of the metal lines can be very high and depends directly on the laser spot size and defocus. The solvent constrains the droplet size of the metal particles, which can increase or maintain the resolution of the laser beam. As this process is a continuous sequence production, the metal line production can be performed at a very rapid rate.

8 Claims, 10 Drawing Sheets

(56) References Cited

OTHER PUBLICATIONS

Written Opinion of the International Preliminary Examining Authority mailed May 14, 2024, from the IPEA/European Patent Office, for International Patent Application No. PCT/IB2023/052781 (filed Mar. 21, 2023), 5 pgs.
"Synthetic isoparaffins", Exxon Mobil Corporation, ExxonMobil Product Solutions, downloaded Jun. 8, 2022 from: https://www.exxonmobilchemical.com/en/products/solvents/synthetic-isoparaffins, 3 pgs.
International Preliminary Report on Patentability dated Sep. 12, 2024, from the IPEA/European Patent Office, for International Patent Application No. PCT/IB2023/052781 (filed Mar. 21, 2023), 6 pgs.
Biver; et al., "Multi-jets formation using laser forward transfer", Applied Surface Science, May 30, 2014, 302:153-158.
International Search Report and Written Opinion mailed Jun. 27, 2023, from the ISA/European Patent Office, for International Patent Application No. PCT/IB2023/052781 (filed Mar. 21, 2023), 14 pgs.

\* cited by examiner

METHODS FOR PRINTING METAL LINES AND PATTERNS AT HIGH RESOLUTION

RELATED APPLICATIONS

This application is a nonprovisional of, claims priority to, and incorporates by reference U.S. Provisional Application No. 63/366,025, filed on 8 Jun. 2022.

FIELD OF THE INVENTION

The present invention relates to methods and apparatus for the fabrication of solid metal lines at high resolution by a laser-assisted deposition of metal from a metal-coated donor substrate.

BACKGROUND

In conventional printing of metal using laser-assisted deposition, a thick metal layer is used as a donor substrate for printing metal droplets on the surface of a substrate. The laser printing involves using a high-power laser to heat the donor substrate. Energy from the laser beam is absorbed by the metal on the donor substrate, causing metal droplets to be ejected from the donor substrate and deposited on the substrate. See, e.g., U.S. Pat. Nos. 10,471,538, 4,970,196, and 5,163,565.

In another approach for metal printing, metal paste is printed by various techniques from screen printing to laser-induced forward transfer (LIFT) or even inkjet printing. The disadvantage of using metal paste is that the printed material is not pure and as a result, the conductivity of the printed material is less than that of pure metal.

The present invention improves upon these and other prior approaches for printing metal on a substrate.

SUMMARY OF THE INVENTION

Objects of the present invention include printing metal lines on a surface at a high resolution, reducing material waste and enhancing the speed of manufacturing. Metal is coated on a surface of a transparent donor substrate (e.g., manually in a non-automated manner), and a solvent is coated on a surface of the metal layer (e.g., manually in a non-automated manner). A laser beam is directed through the transparent donor substrate in order to scan a pattern on the metal layer. Points on the metal layer that the laser beam is focused on are heated and such heating causes a stream of nano particles to be jetted from the donor substrate. The trajectory of the nano particles is constrained to be perpendicular to an extent of the donor substrate due to the presence of the solvent.

In some embodiments of the present invention, a transparent film of plastic is used as the carrier (i.e., donor substrate) for the metal layer. In some embodiments of the present invention, a transparent glass plate is used as the carrier for the metal layer.

In some embodiments of the present invention, the printing takes place while the solvent layer of the donor substrate is in direct contact with the surface of the receiver substrate to increase the final resolution of the metal lines. In other embodiments of the present invention, the printing takes place while the solvent layer is not in direct contact with the surface of the receiver substrate, but rather is separated by some distance (e.g., 200 microns) from the surface. For example, in one embodiment, the solvent layer is separated from the surface of the receiver substrate by 500 microns or less during the jetting of the metal particles.

In some embodiments of the present invention, the donor substrate is transparent to wavelength(s) of radiation emitted by the laser beam and such donor substrate can be used when paired with the laser with the matching wavelength(s).

In some embodiments of the present invention, the laser that is used for the process is an infrared (IR) laser, a visible wavelength laser or an ultra-violet (UV) laser.

In some embodiments of the present invention, the metal layer coating a surface of the donor substrate can be created by any known chemical or physical coating process. However, in a preferred embodiment, a thermal coating process which deposits metal from a metal target is used, because such process is capable of depositing a very precise and uniform metal layer on the donor substrate.

In some embodiments of the present invention, the metal layer can be copper, but could also be other metals.

In some embodiments of the present invention, the solvent that is used for the process is chemically compatible with the metal used in the process and has a low boiling point. In contrast, a solvent that is not compatible with the metal can increase the oxidation of the metal during the laser jetting or increase the presence of other side reactions. Therefore, it is important to choose a solvent with a low tendency to react with the metal to be deposited on the receiver substrate. It is also important to choose a solvent with a high enough boiling point so that it will not evaporate from the donor substrate prior to the jetting of the metal particles at the beginning of the process. It is also important that the solvent will have a low enough boiling point so that it will evaporate from the metal particles during or right after the jetting of the metal particles.

In some embodiments of the present invention, a metal can be jetted with the aid of any solvent with a high enough boiling point. Water may even be used as the solvent.

In some embodiments of the present invention, the metal may be jetted with a non-polar solvent such as ISOPAR™ (provided by ExxonMobil of Irving, TX) with a medium boiling point or polar solvents such as tetrahydrofuran (THF). However, the preferred solvents are solvents with boiling points between 50-150° C. with a low number of reactive components (e.g., inert solvents).

In some embodiments of the present invention, the metal-coated donor substrate for the process can be semi-transparent to the laser wavelength. However, in that case, a higher energy laser will be needed for the process.

In some embodiments of the present invention, the metal thicknesses that can be produced by the jetting process are quite thick. However, the most important application for the current process involves using a transparent donor substrate that is coated with a copper layer.

In a preferred embodiment, the donor substrate may be a polyester (PET) film with a thickness of 50 microns that is coated by a copper layer with a thickness of 100 microns. The surface of the copper layer facing the receiver substrate may be coated with a layer of solvent. In a preferred embodiment, the solvent is ISOPAR™ with a 63° C. boiling point and no reactive components on its backbone.

In some embodiments of the present invention, the energy emitted by the laser and the distance between the laser and the focal point of the laser beam on the metal layer will determine the spot size and the effect of the laser beam on the metal layer.

In some embodiments of the present invention, the solvent will act as a boundary for the nano particles that are produced during the jetting and instead of an uncontrolled stream of nano particles that can travel in all directions in the air, the solvent membrane enveloping the metal particles will constrain the trajectory of the metal particles.

In some embodiments of the present invention, when the solvent membrane that is filled with the metal nano particles lands on the surface of the receiver substrate, the solvent will evaporate at ambient conditions.

In some embodiments of the present invention, the evaporation process can take place at higher temperatures by a variety of heating processes, including heating the surface of the receiver substrate with a heater, a stream of hot air or a laser beam in order to sinter the metallic particles. At the end of the process, the sintering of the metal particles creates a metallic conductive pattern on the surface. The conductivity of the metallic conductive pattern on the surface of the receiver substrate can equal the conductance of a pure metal since no organic materials are present in the final metallic conductive pattern.

These and further embodiments of the invention are described in detail below.

BRIEF DESCRIPTION OF THE DRAWINGS

The present invention is illustrated by way of example, and not limitation, in the figures of the accompanying drawings, in which.

DETAILED DESCRIPTION OF THE INVENTION

Figure 1B:
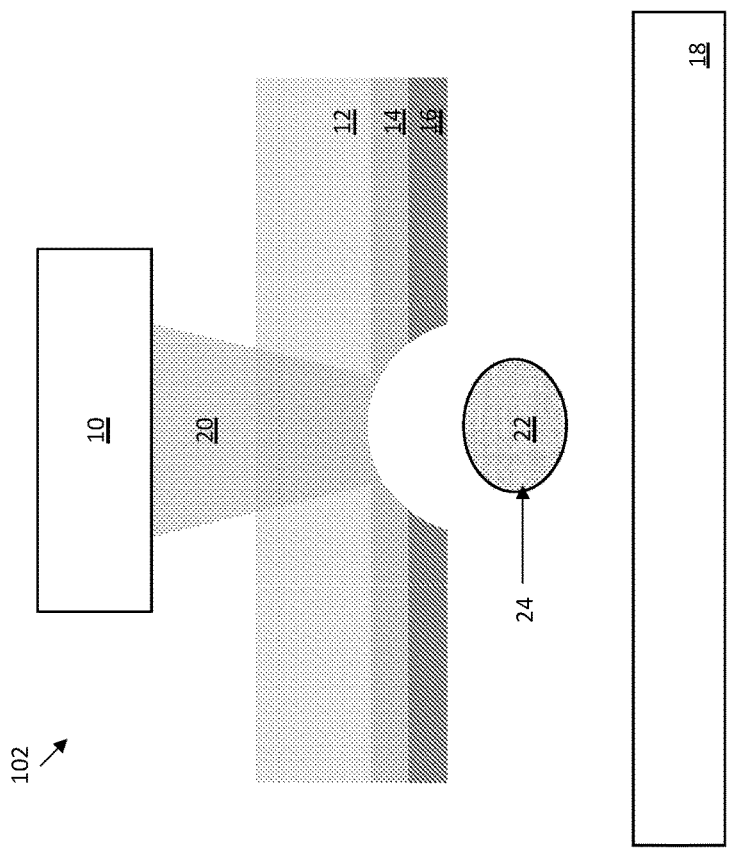
FIG. 1B depicts a cross sectional view showing the printing of metal from a donor substrate, in which a solvent envelope filled with metal particles is ejected from the donor substrate towards the receiver substrate, in accordance with one embodiment of the invention.

The present invention provides a much faster way to fabricate metal lines and patterns on a receiver substrate at a high resolution by applying a solvent layer to metal-coated donor substrate. The laser jetting involves ejecting metal particles, constrained within a solvent membrane, from a metal layer coated on the donor substrate. Once the metal particles have been deposited onto a receiver substrate, the solvent can be evaporated.

Since this printing procedure can be performed with the solvent layer in direct contact with the receiver substrate (or separated therefrom by a small distance), the resolution of the metal lines is very high and depends directly on the laser spot size and defocus. The solvent constrains the droplet size of the metal particles, which can increase or maintain the resolution of the laser beam. As this process is a continuous sequence production, the metal line production can be performed at a very rapid rate.

Before describing the invention in detail, it is helpful to present an overview. The invention generally relates to the laser-assisted deposition of metal particles from a donor substrate 12 onto a receiver substrate 18. As illustrated in the printing system 100 depicted in FIG. 1A, a printing unit 10 is used to direct a laser beam 20 towards a donor substrate 12 that has been coated with a metal layer 14, causing metal particles 22 to be jetted towards the surface of a receiver substrate 18. The jetted metal particles 22, however, travel in uncontrolled stream (e.g., in a spray or mist form) that can diffuse in air to distant locations. Such uncontrolled (or loosely controlled) trajectory of the metal particles 22 is undesirable as it reduces the resolution at which the printing of metal on the receiver substrate 18 can be performed as well as can cause contamination of equipment in the surrounding workspace.

Figure 1A:
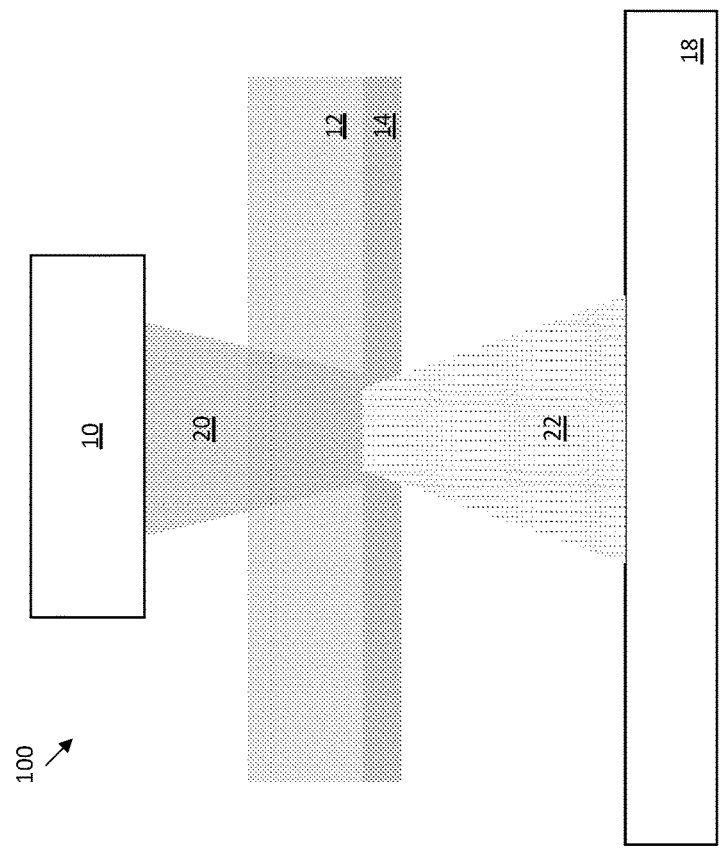
FIG. 1A depicts a cross sectional view showing the printing of metal from a donor substrate, in which metal particles are sprayed from the donor substrate onto a receiver substrate.

To address such shortcoming of the printing system 100, a surface of the metal layer 14 (facing the receiver substrate 18) may be coated with a solvent layer 16, as depicted in the printing system 102 of FIG. 1B. When the printing unit 10 directs the laser beam 20 towards the donor substrate 12 in the printing system 102, the metal particles 22 are constrained within a solvent membrane 24 as the metal particles 22 are released from the metal layer 14. Such solvent membrane 24 filled with metal particles 22 then is then jetted towards the receiver substrate 18. The resulting effect is that the trajectory of the metal particles 22 can be much more stringently controlled (e.g., trajectory can be controlled to be perpendicular to the surface of the receiver substrate 18). Accordingly, the resolution at which the metal particles 22 can be printed on the receiver substrate 18 can be greater than the resolution possible from the printing system 100 depicted in FIG. 1A.

In one embodiment, the donor substrate 12 may be a film of plastic or glass. In one embodiment, the donor substrate 12 is a continuous transparent film substrate. In a preferred embodiment, the donor substrate 12 is a transparent plastic film to allow a direct contact to more easily be formed between the solvent layer 16 and the receiver substrate 18. One benefit of a direct contact is an increase in the final printing resolution. However, the same printing technique can still be applied with the donor substrate 12 separated by some distance from the receiver substrate 18, albeit with a possible reduction in the printing resolution.

In one embodiment, the donor substrate 12 may be transparent to the wavelengths of radiation present in the laser beam 20. The radiation may include infra-red (IR) light, visible light or ultra-violet (UV) light. Therefore, the films that can be used for the process are almost unlimited, because almost any film of material used as the donor substrate 12 will be transparent to at least one of the wavelengths mentioned above.

The metal layer 14 coating a surface of the donor substrate 12 can be created by any known chemical or physical coating mechanism. However, in a preferred embodiment, a thermal coating process which deposits metal from a metal target is used, because such a process is capable of depositing a very precise and uniform metal layer 14 on the donor substrate 12. The metal layer 14 can include any metal, but in the most important application of creating metal conduction lines on printed circuit boards (PCBs) and other surfaces, the metal layer 14 includes copper.

The key properties of the solvents to consider when selecting the solvent are its compatibility to the metal in the metal layer 14 and its boiling point. The reason is that a non-compatible solvent can increase the oxidation of the metal during the laser jetting or can increase the occurrence of other side reactions. Therefore, it is important to choose a solvent with a low tendency to react with the metal in use. It is also important to choose a solvent with a high enough boiling point so that it will not evaporate from the donor substrate 12 prior to the jetting of the metal particles 22 at the start of the process. It is also important that the solvent will have a low enough boiling point so that it will evaporate from the metal particles 22 during or right after the jetting.

Some metals (e.g., metals that do not tend to react) can be jetted with the aid of any solvent with a high enough boiling point (e.g., water). Other metals will need to be jetted with non-polar solvents such as ISOPAR™ with a medium boiling point or polar solvents such as tetrahydrofuran (THF). However, in a preferred embodiment, solvents with respective boiling points between 50-150° C. and a low number of reactive components (i.e., inert solvents) are used.

Figure 2A:
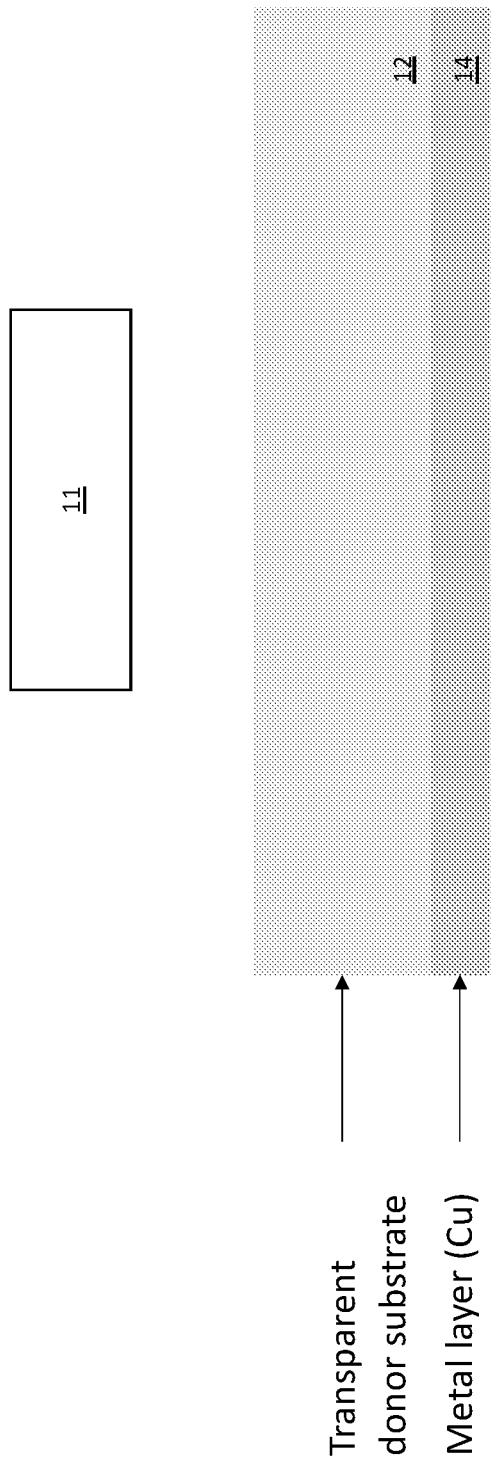
FIG. 2A depicts a cross sectional view showing a donor substrate that has been coated with a metal layer, in accordance with one embodiment of the invention.

FIGS. 2A-2H depict a sequence of drawings to illustrate a coating process using a coating unit 11, followed by a metal jetting process using a printing unit 10. As depicted in FIG. 2A, a donor substrate 12, more specifically its bottom surface, is first coated with a metal layer 14. As previously explained, the type of material used for donor substrate 12 is almost unlimited. Almost any plastic can be used, and even colored films can be considered if they are transparent to the wavelength(s) of the laser beam 20. Furthermore, the thickness of the metal layer 14 on the donor substrate 12 can be as thin as one nanometer or as thick as one micron. Therefore, the variety of metals and metal thicknesses that can be printed by the jetting process is very high.

However, the most important application for the current process is depicted in FIG. 2A, in which a transparent donor substrate 12 is coated with a copper layer 14. In a preferred embodiment, the donor substrate 12 may be a polyester (PET) film with a thickness of 50 microns that is coated by a copper layer with a thickness of 100 microns.

Figure 2B:
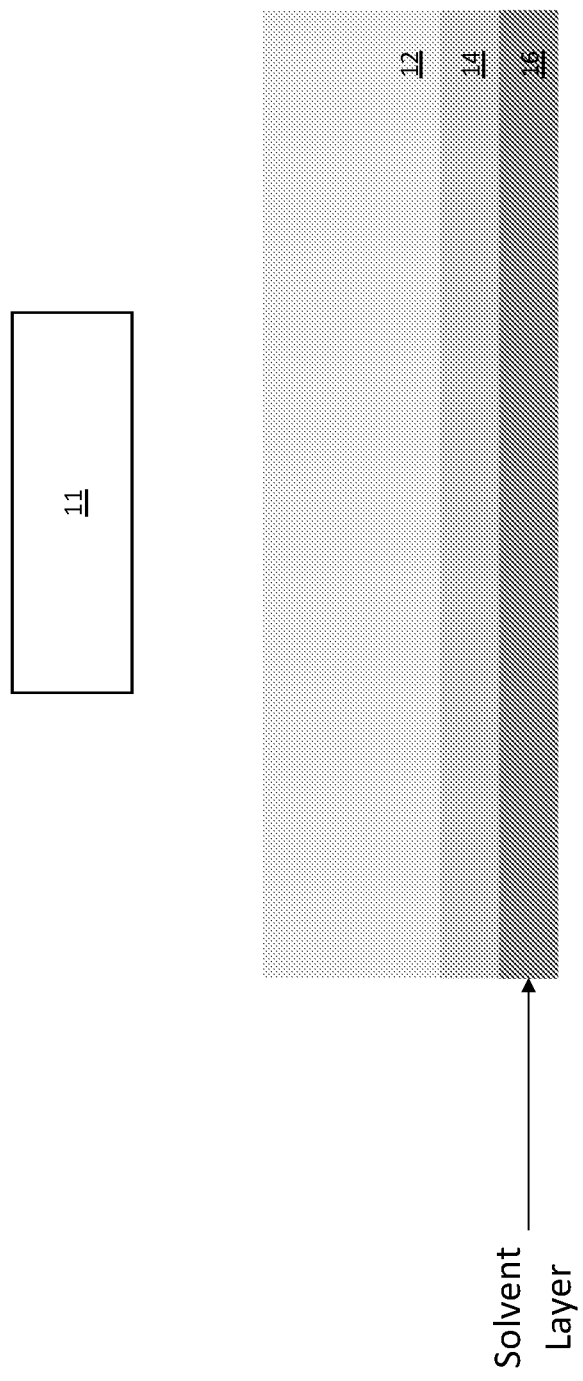
FIG. 2B depicts the donor substrate of FIG. 2A that has been additionally coated with a solvent layer, in accordance with one embodiment of the invention.

As depicted in FIG. 2B, the surface of the metal layer 14 facing the receiver substrate 18 may be coated with a layer of solvent 16. In one embodiment, the solvent layer 16 has a uniform thickness. In a preferred embodiment, the solvent is ISOPAR™ with a 63° C. boiling point and no reactive components on its backbone.

Figure 2C:
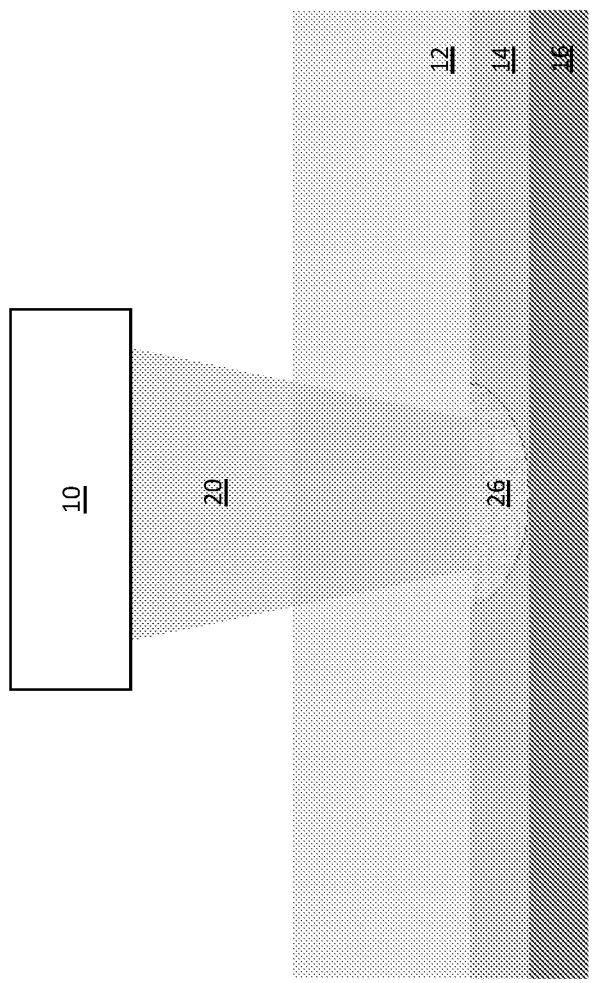
FIG. 2C depicts a cross sectional view showing a region of the metal layer being heated by a laser beam, in accordance with one embodiment of the invention.

As depicted in FIG. 2C, a printing unit 10 may direct a laser beam 20 towards the donor substrate 12, which causes a region 26 of the metal layer 14 to be heated. As previously mentioned, the laser beam 20 may include light in the ultra-violet (UV), infra-red (IR) and/or visible spectrums. The energy emitted by the laser (not depicted) and the distance between the laser (not depicted) and the focal point of the laser beam 20 on the metal layer 14 will determine the spot size and the effect of the laser beam 20 on the metal layer 14. In one embodiment, the laser is a high-frequency laser.

Figure 2D:
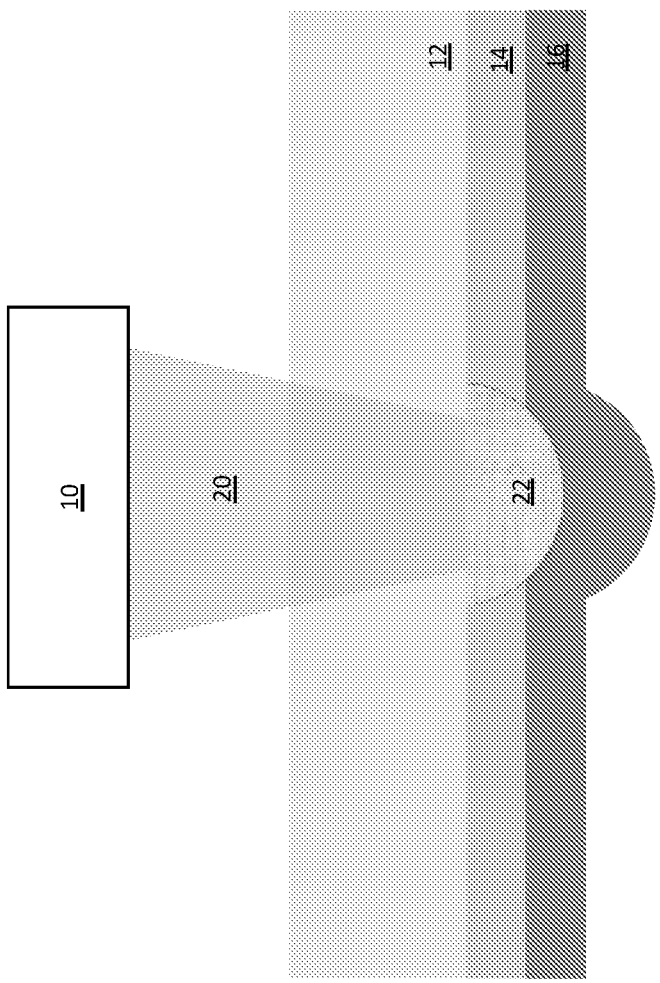
FIG. 2D depicts the effect of the laser heating, in which a portion of the metal layer is transformed into metal particles, in accordance with one embodiment of the invention.
Figure 2E:
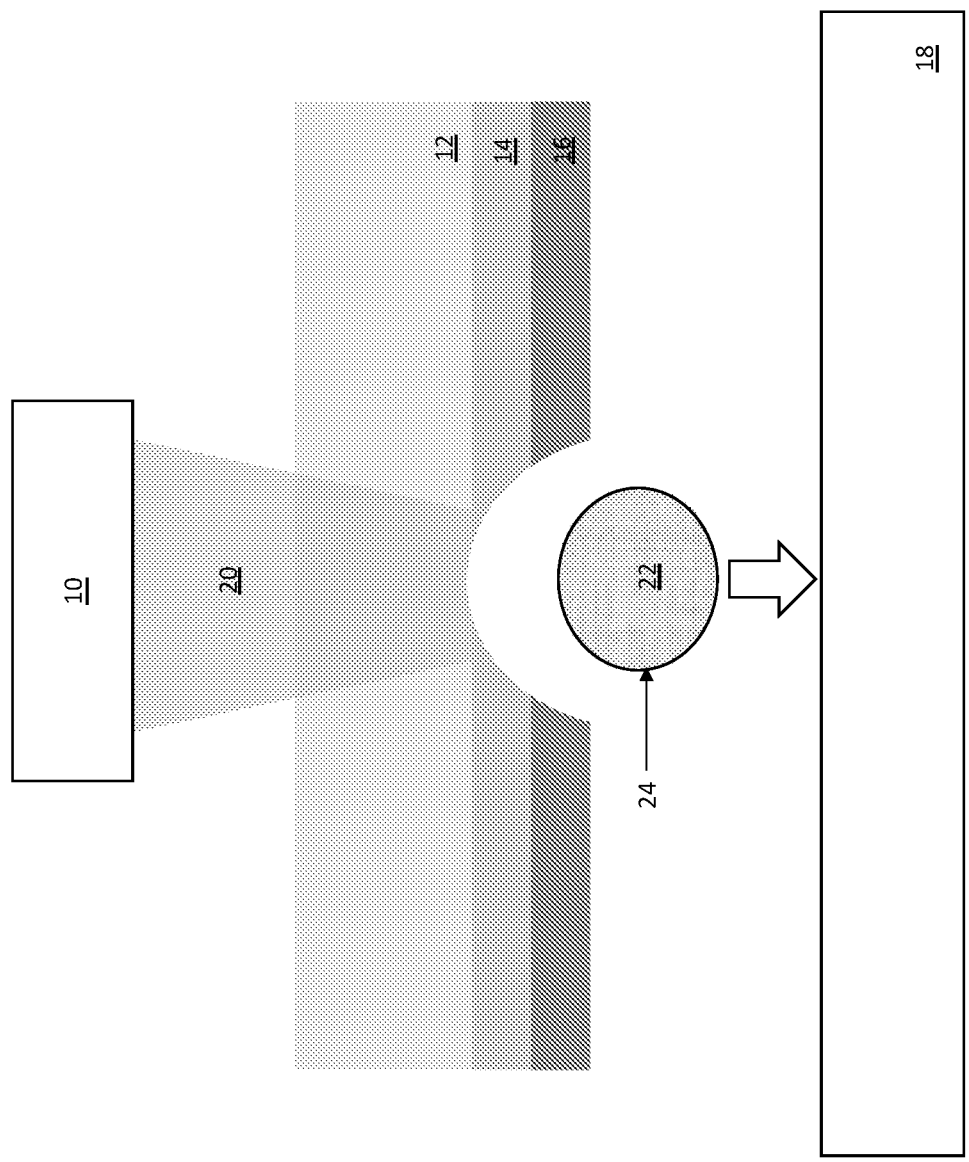
FIG. 2E depicts a cross sectional view showing metal particles being constrained within a solvent membrane, in accordance with one embodiment of the invention.

FIG. 2C illustrates the effect of shining the laser beam 20 on the metal-coated donor substrate 12. Heat is absorbed on the side of the metal layer 14 facing the printing unit 10 and metal particles 22 (e.g., on the scale of nanometers) begin to form, as depicted in FIG. 2D. At this point in the process, the presence of the solvent layer 16 becomes relevant: instead of an uncontrolled stream of metal particles 22 that can travel in the air to all directions, the solvent layer 16 constrains the trajectories of the respective metal particles 22. As a result of the solvent layer 16, the metal particles 22 are enveloped within a solvent membrane 24 as the metal particles 22 travel toward the surface of the receiver substrate 18 in a direction normal to the surface of the donor substrate 20, as depicted in FIG. 2E.

Figure 2F:
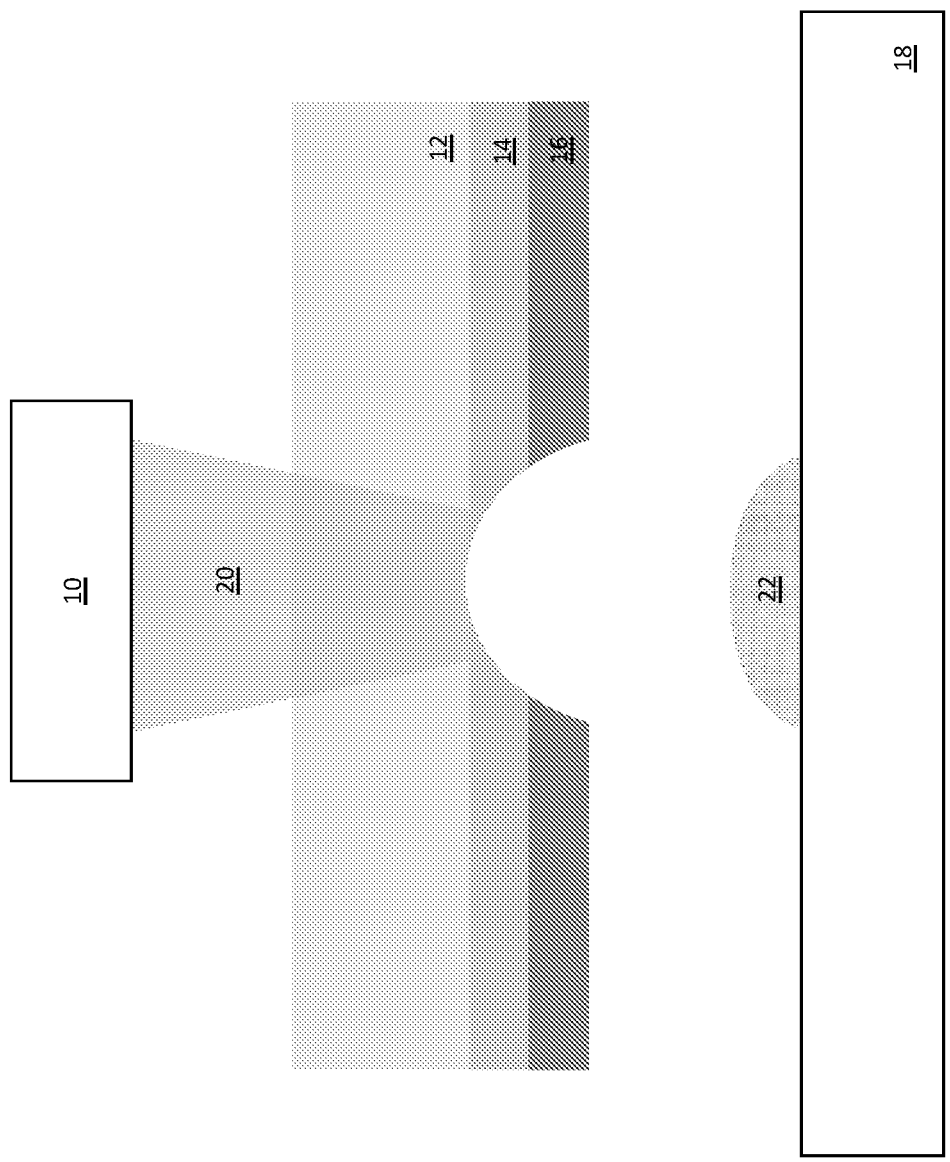
FIG. 2F depicts a cross sectional view showing the metal particles landing on the receiver substrate, in accordance with one embodiment of the invention.
Figure 2G:
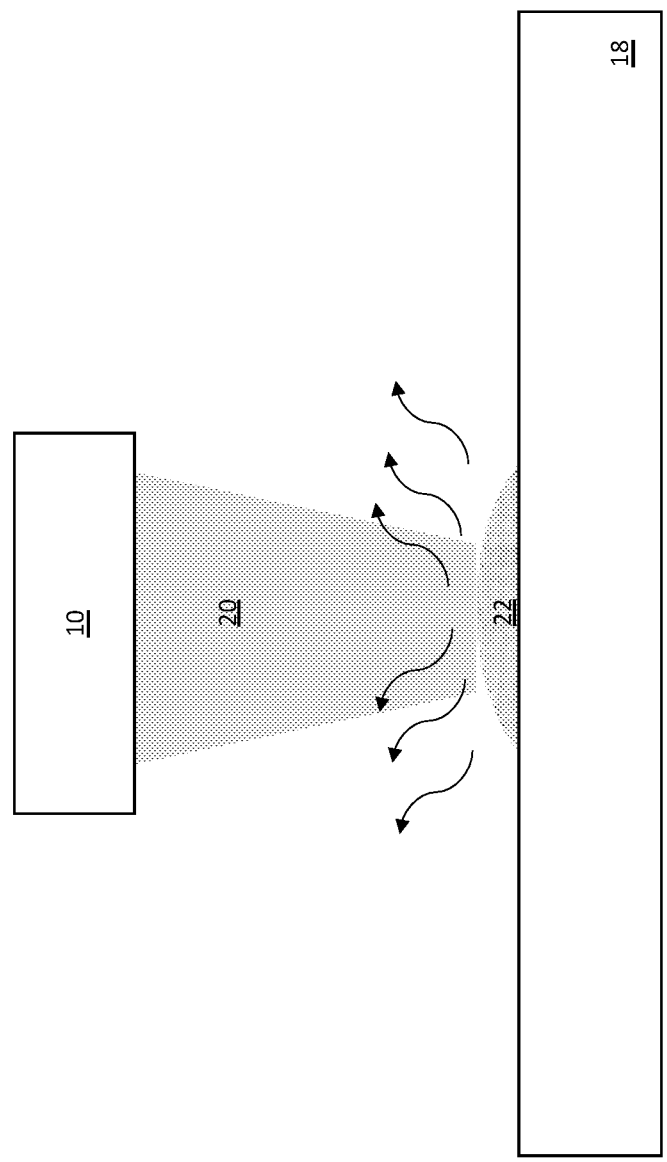
FIG. 2G depicts a cross sectional view showing the evaporation of the solvent as well as the sintering of the metal particles, in accordance with one embodiment of the invention.

When the solvent membrane 24 with the metal particles 22 therein contacts the surface of the receiver substrate 18, as depicted in FIG. 2F, the solvent starts to evaporate. The evaporation can occur at ambient conditions if a slow evaporation is desired. Otherwise, the evaporation can occur more quickly at higher temperatures by heating the surface of the receiver substrate 18 with a heater, a stream of hot air, or the laser beam 20 to sinter the metallic particles, as depicted in FIG. 2G. In one embodiment, the evaporation of the solvent may take place in a controlled environment or in ambient conditions.

Figure 2H:
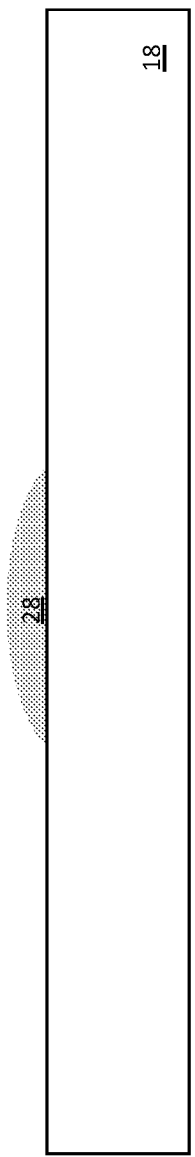
FIG. 2H depicts a cross sectional view of a metal structure on the receiver substrate after the metal particles have been sintered, in accordance with one embodiment of the invention.

At the end of the printing process, the sintering of the metal particles 22 forms a metallic conductive pattern 28 on the surface of the receiver substrate 18. The conductivity of the metallic conductive pattern 28 can equal the conductance of a pure metal since no organic material is present in the final metallic conductive pattern 28, as shown in FIG. 2H.

Figure 3:
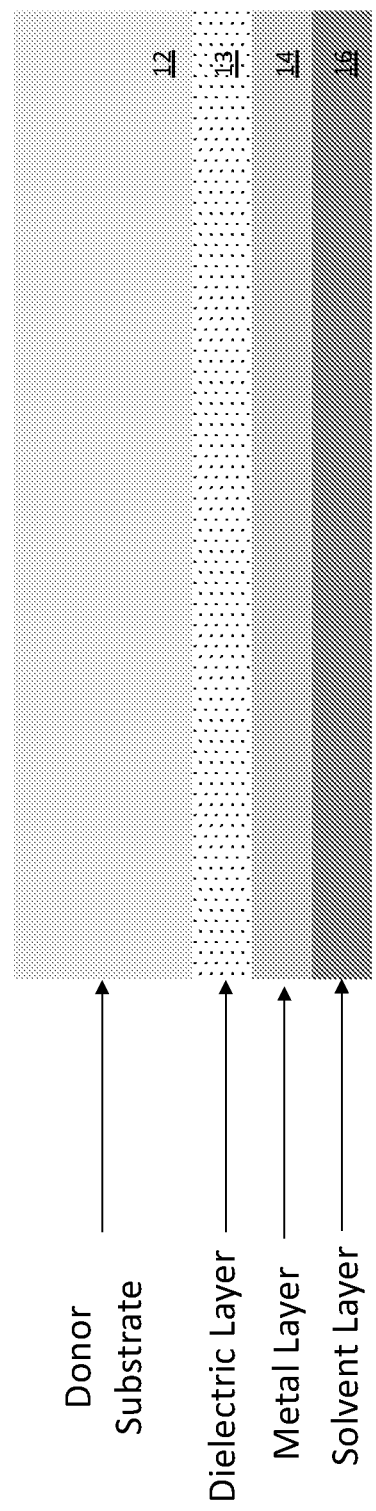
FIG. 3 depicts a cross sectional view showing an alternative coating of the donor substrate in which a dielectric layer is sandwiched between the donor substrate and the metal layer, in accordance with one embodiment of the invention.

FIG. 3 depicts an alternative embodiment in which a dielectric layer 13 is disposed between the donor substrate 12 and the metal layer 14. The dielectric layer 13 may include an adhesive such as glue to enhance the adhesion of the metal layer 14 to the donor substrate 12, which is advantageous for some types of metals which would otherwise have difficulty adhering to the donor substrate 12.

Thus, systems and methods for printing metal lines and patterns at high resolution have been described. Many other embodiments will be apparent to those of skill in the art upon reviewing the above description. The scope of the invention should, therefore, be determined with reference to the appended claims, along with the full scope of equivalents to which such claims are entitled.

LIST OF REFERENCE NUMERALS

10 Printing unit
11 Coating unit
12 Donor substrate
13 Dielectric layer
14 Metal layer
16 Solvent layer
18 Receiver substrate
20 Laser beam 22 Metal particles
24 Solvent membrane
26 Heated region of metal layer
28 Deposited metal
100 Printing system
102 Printing system

What is claimed is:

1. A method, comprising:
coating a surface of a donor substrate with a metal layer;
coating a surface of the metal layer with a solvent layer; and
directing a laser beam towards the donor substrate so as to jet metal particles towards a receiver substrate, wherein the metal particles are constrained within a solvent membrane formed by the solvent layer while being jetted towards the receiver substrate.

2. The method of claim 1, wherein the solvent layer has a uniform thickness.

3. The method of claim 1, wherein the solvent layer comprises a non-polar solvent with a boiling point between 50° C.-150° C.

4. The method of claim 1, further comprising evaporating solvent from the metal particles in a controlled environment or in ambient conditions.

5. The method of claim 1, further comprising forming conductive metal lines and patterns on a surface of the receiver substrate from the metal particles.

6. The method of claim 1, wherein the solvent layer contacts the receiver substrate during the jetting of the metal particles.

7. The method of claim 1, wherein the solvent layer is separated from a surface of the receiver substrate by 500 microns or less during the jetting of the metal particles.

8. A method, comprising:
coating a surface of a donor substrate with a dielectric layer;
coating a surface of the dielectric layer with a metal layer;
coating a surface of the metal layer with a solvent layer; and
directing a laser beam towards the donor substrate so as to jet metal particles towards a receiver substrate, wherein the metal particles are constrained within a solvent membrane formed by the solvent layer while being jetted towards the receiver substrate.

* * * * *